United States Patent [19]

Ishihara et al.

[11] Patent Number: 4,465,705
[45] Date of Patent: Aug. 14, 1984

[54] METHOD OF MAKING SEMICONDUCTOR DEVICES

[75] Inventors: Takeshi Ishihara, Neyagawa; Keiichi Kagawa, Osaka, both of Japan

[73] Assignee: Matsushita Electric Industrial Co., Ltd., Kadoma, Japan

[21] Appl. No.: 466,142

[22] Filed: Feb. 14, 1983

Related U.S. Application Data

[63] Continuation of Ser. No. 264,206, May 15, 1981, abandoned.

[30] Foreign Application Priority Data

May 19, 1980 [JP]  Japan ................................. 55-66777
Sep. 19, 1980 [JP]  Japan ............................... 55-130935
Dec. 17, 1980 [JP]  Japan ............................... 55-179443

[51] Int. Cl.$^3$ ............................................ H01L 21/76
[52] U.S. Cl. ..................................... 427/38; 156/653; 156/657; 427/93; 427/94
[58] Field of Search ............................ 427/93, 94, 38; 156/653, 657

[56] References Cited

U.S. PATENT DOCUMENTS 3,900,350  8/1975  Appels .................................. 427/94
3,911,168  10/1975 Schinella .............................. 427/94
3,961,999  6/1976  Antipov ................................ 29/580
4,016,007  4/1977  Wada ..................................... 427/94
4,113,515  9/1978  Kooi ..................................... 427/94
4,292,156  9/1981  Matsumoto ........................... 427/94

OTHER PUBLICATIONS

Appels "Local Oxidation of Silicon . . . " Philips Res. Repts. 25, pp. 118–132, 1970.

Primary Examiner—John D. Smith
Attorney, Agent, or Firm—Cushman, Darby & Cushman

[57] ABSTRACT

A method of masking semiconductor devices provided with selectively formed oxide film patterns, can be made by very precisely copying from selective oxidation mask patterns.

The method in accordance with the present invention comprises a first step of forming an anti-oxidation film pattern in a semiconductor body, with at least brim portions of said anti-oxidation film pattern buried therein, and a second step of oxidizing regions on a surface of said semiconductor body to form oxidized regions by use of said anti-oxidation film pattern as a selective oxidation mask, thereby forming at least a part of said oxidized regions of said semiconductor body in a manner to have their bottom disposed deeper than that of said anti-oxidation film pattern in said semiconductor body.

2 Claims, 19 Drawing Figures

METHOD OF MAKING SEMICONDUCTOR DEVICES

CROSS-REFERENCE TO RELATED APPLICATIONS

This is a continuation of earlier application Ser. No. 264,206 filed May 15, 1981, now abandoned.

BACKGROUND OF THE INVENTION

1. Field of the Invention:

The present invention relates to methods of making semiconductor devices, more particularly to methods of making semiconductor devices by the adoption of an improved set of selective oxidation steps using anti-oxidation films as oxidation masks.

2. Prior Art:

It has become widely known, as LOCOS (localized oxidation of silicon) or ISOPLANAR structures, to selectively oxidize silicon substrates by use of silicon nitride films as anti-oxidation masks. But, as a result of strong demand of high integration degrees in ICs (integrated circuits), high resolution in IC pattern forming is more and more demanded. Consequently, it is revealed that the conventional pattern forming is insufficient, that is, it is difficult or impossible to obtain high resolution IC patterns with shapes precisely same as those of anti-oxidation films employed as a mask, for the following reasons to be described.

Figure 1A:
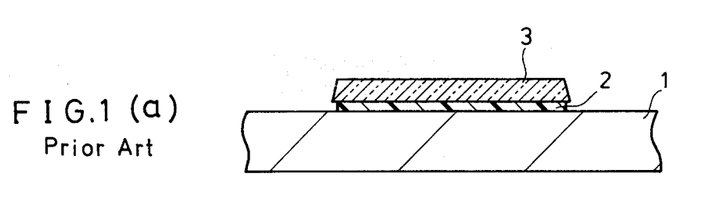
FIG. 1(a) to FIG. 1(c) are cross-sectional views showing semiconductor device structures at several conventional process steps.
Figure 1B:
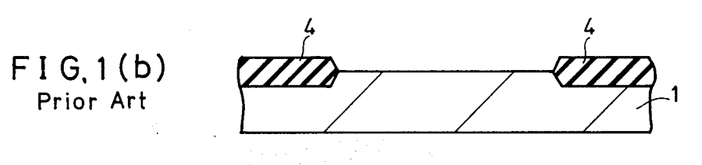

The conventional processes will be described by referring to the accompanying drawings. FIG. 1(a) and FIG. 1(b) are cross-sectional views of a semiconductor structure at process steps to obtain a conventional LOCOS structure. A silicon nitride ($Si_3N_4$) film 2 is deposited by a known CVD (chemical vapor deposition) method on the entire face of a front surface of a silicon substrate 1. In this case, a thin silicon oxide layer (not shown) may be formed on the silicon substrate 1 before the deposition of the silicon nitride film 2, in order to reduce strain produced at the interface between the semiconductor substrate 1 and the silicon nitride film 2, if the latter 2 is formed directly on the former 1. A photo-sensitive material is applied onto the silicon nitride film 2, followed by light exposuring to form a photo resist film pattern 3 for selective oxidation, by using a photomask. Then, the silicon nitride film 2 is etched by use of the photo resist film pattern 3 as an etching mask thereby copying the photo resist film pattern 3 onto the silicon nitride film and obtaining a silicon nitride film pattern 2 as shown in FIG. 1(a).

Thereafter, the photo resist film pattern 3 is removed, and the silicon substrate 1 is heated in an oxygen atmosphere in order to grow an oxidation film 4. The oxidation film 4 is formed at the surface of the silicon substrate 1 not covered with the silicon nitride film pattern 2, as a result of the oxidation of the silicon substrate 1. During the oxidation the oxygen atoms can not diffuse into the silicon nitride film pattern 2, which thus serves as an anti-oxidation film. Removing of the silicon nitride film pattern 2 by use of hot phosphoric acid heated at about 150° C. is a final step of the selective oxidation process as shown by FIG. 1(b).

Figure 1C:
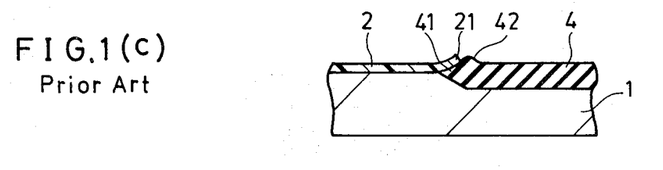

The selective oxidation process described above has been employed to selectively oxidize the surface of the silicon substrate 1 by use of the silicon nitride film 2 as the mask for the selective oxidation, and to form separated insulating regions on and/or in the semiconductor devices. But such a conventional selective oxidation process has the following shortcomings. FIG. 1(c) is an enlarged cross-sectional view showing the right half-portion of the silicon substrate 1 shown in FIG. 1(b). The silicon substrate 1 has a structure shown in FIG. 1(c), when investigated microscopically. That means, the oxidation film 4 is not uniformly formed on the surface of the silicon substrate 1. A brim portion 41 of the oxidation film 4 grows under an end portion of the silicon nitride film pattern 2 thereby to raise an end portion 21 of the silicon nitride film 2. The brim portion 41 of the anti-oxidation film 4 is so-called "bird beak" region. In addition, the oxidation film 4 has an upheaved protuberance 42 called as "bird head". The formation of these irregular oxidation film portions 41 and 42 arises from the fact that the oxidation atoms uniformly diffuse into the silicon substrate 1 underneath the end portion of the silicon nitride film, and that after the oxidation the volume of the silicon substrate surface swells twice as large as the initial volume thereof. The abovementioned irregular oxidation spoils uniformity of the resultant oxidation film and reproducibility of the oxidation film pattern. Thus, it is inevitably necessary to suppress the irregular oxidation as much as possible, when fine and accurate oxidation film patterns are required to be formed with a superior controllability.

Figure 2A:
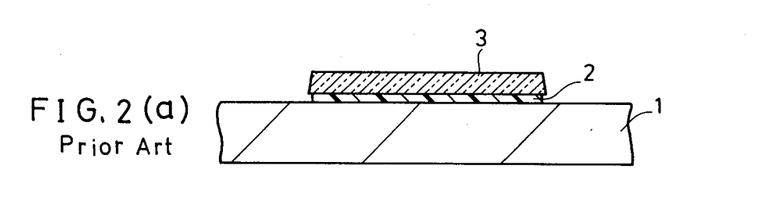
FIG. 2(a) to FIG. 2(c) are cross-sectional views showing semiconductor device structures using another set of conventional process steps.
Figure 2B:
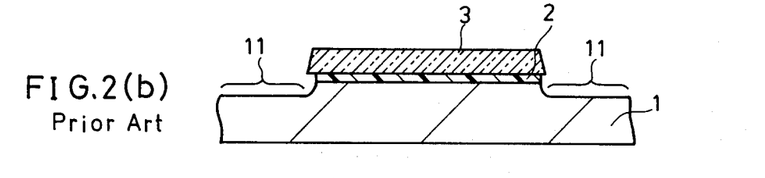
Figure 2C:
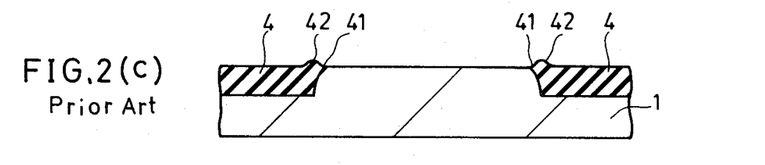

Another conventional selective oxidation process will be described by referring to FIGS. 2(a) to 2(c). FIGS. 2(a) to 2(c) are cross-sectional views showing semiconductor device structures at several processing steps. In this case, the exemplified method purports to diminish uneven surface areas on the surface of the semiconductor devices. Such semiconductor devices are produced by the following steps. A silicon nitride film 2 is formed on a silicon substrate 1, and a photo resist film 3 is applied on the silicon nitride film. Then, a photo resist film pattern 3 is obtained by using a photo mask with a specified pattern, and the silicon nitride film 2 is selectively etched by use of the photo resist film pattern 3 as an etching mask thereby forming a silicon nitride film pattern 2 as shown in FIG. 2(a).

By further continuing the etching for the front surface of the silicon substrate 1, concave portions 11 are formed as shown in FIG. 2(b). A depth of the concave portions 11 formed in the silicon substrate 1 is selected to be as thick as about a half of a desired thickness of an oxidation film to be formed later. Next, the photo resist film pattern 3 is removed, and selective oxidation is carried out by use of the silicon nitride film pattern 2 as an anti-oxidation mask. The silicon nitride film pattern 2 is stripped off thereafter as shown in FIG. 2(c).

The semiconductor device structure shown in FIG. 2(c) has a much more even principal surface as compared with the case of FIG. 1(b). But, there still exist bird beak regions 41 and bird head regions 42 in the resultant oxidation film 4 as shown in FIG. 2(c). Although the selective oxidation process is widely employed in the semiconductor device industry, it has the shortcomings that the obtained selective oxidation films inherently have irregularly oxidized regions known as bird beak and bird head, as described above. In addition to the case of oxidizing the single crystalline silicon substrate, similar problems are encountered in selective oxidation of polycrystalline silicon films. Such selective oxidation of poly-Si films is necessary, for example in forming poly-Si conductive patterns or poly-Si gate regions for MOS-type field effect transistors.

SUMMARY OF THE INVENTION

The present invention provides methods of making semiconductor devices by using an improved selective oxidation for the purposes of obtaining fine selective oxidation film patterns, which are almost free from the conventional problems, i.e. formation of bird beak and bird head regions.

DESCRIPTION OF THE PREFERRED EMBODIMENTS

The present invention provides a method of making semiconductor devices comprising:

a first step of forming an anti-oxidation film pattern in a semiconductor body, with at least brim portions of the anti-oxidation film pattern buried therein, a second step of oxidizing the semiconductor body by use of the anti-oxidation film pattern as a selective oxidation mask thereby disposing at least a part of the oxidized regions of the semiconductor layer deeper than the anti-oxidation film pattern in the semiconductor layer.

The semiconductor body implies a simple semiconductor substrate as such or a semiconductor substrate with an overriding semiconductor layer formed thereon.

Figure 3:
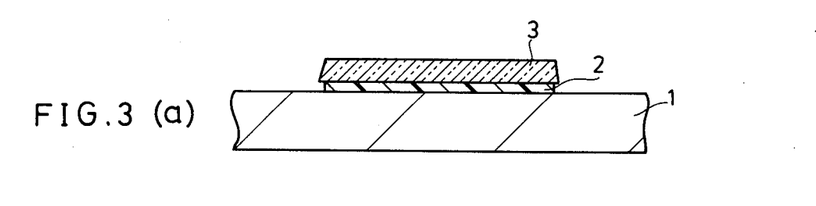
FIG. 3(a) to FIG. 3(d) are cross-sectional views showing semiconductor device structures at several steps in a first example embodying the present invention.

FIG. 3(a), FIG. 3(b), FIG. 3(c) and FIG. 3(d) are cross-sectional views showing structures at several steps of making a semiconductor device in a first example process embodying the present invention. A silicon nitride film 2 of about 1,000 Å is formed on a front surface of a silicon substrate 1 by a known CVD (chemical vapor deposition) method. In this case, it may be preferable to form a thin underlying oxidation film (not shown) on the silicon substrate 1 before the formation of the silicon nitride film 2. Such a thin silicon oxide film serves to diminish stress residing at the interface between the silicon substrate 1 and the silicon nitride film. Then, a photo sensitive material 3 is applied on the silicon nitride film by use of a spinner, followed by light exposure to form a photo resist film pattern 3 for selective oxidation, by using a photomask. Then, the silicon nitride film 2 is etched by a plasma etching method by using the photo resist film pattern 3 as an etching mask thereby obtaining a silicon nitride film pattern 2 as shown in FIG. 3(a).

Thereafter, the photo resist film pattern 3 is removed, and a poly-crystalline silicon film (hereinafter referred to as poly-Si film) 5 of e.g. 100–1,000 Å is deposited on the entire surface of the silicon nitride film pattern 2, by a CVD method under an atmospheric or lower pressure as shown in FIG. 3(b).

Then, the entire surface of the poly-Si film 5 is oxidized in an oxygen atmosphere thereby to obtain an oxide film thereon. The oxide film consists of thicker oxide film portions 51 and a thinner oxide film portion 52. The thinner oxide film portion 52 on the silicon nitride film pattern 2 is produced as a result of the oxidation of the respective portion of the poly-Si film 5. A thickness of the oxide film portion 52 is twice as thick as that of the initial poly-Si film 5. On the other hand, the thicker oxide film portion 51 is produced by the oxidations of the poly-Si film 5 and the surface of the silicon substrate 1 together. Thus, the thickness of the thicker oxide film portion 51 is thicker than that of the thinner oxide film portion 52 as shown in FIG. 3(c). The thickness of the thicker oxide film portion 51 is selected to be 200–2,000 Å, thicker than a field oxide film thickness of for example 5,000–10,000 Å.

Subsequently, the thinner oxide film portion 52 on the silicon nitride film pattern 2 is selectively etched away, and the exposed silicon nitride film pattern 2 is removed from the surface of the silicon substrate 1, thereby to obtain an oxide film pattern 51' as shown in FIG. 3(d). A thickness of the oxide film pattern 51' is slightly thinner than that of the oxide film portion 51, since the surface of the oxide film portion 51 is simultaneously etched when the oxide film portion 52 is stripped off. When such simultaneous etching for the oxide film pattern 51 should be avoided, the oxide film portion 52 may be etched away after forming a photo resist film pattern on the oxide film portion 51.

The manufacturing method described above by referring to FIG. 3(a) to FIG. 3(d) has an advantageous feature that formation of bird beak and bird head regions can be minimized. This is because the brim portions of the silicon nitride film pattern 2 are completely covered with the poly-Si film 5, contrary to the conventional cases where semiconductor substrate surfaces to be oxidized are directly exposed to an oxygen atmosphere. Accordingly, it is possible to carry out a selective oxidation thereby enabling forming of oxide film patterns with superior accuracy, therefore, copying from very fine mask patterns to the oxide films can be made with superior accuracy. Although definite reasons for such superior selective oxidation are not clear, it seems that the formation of the bird beak and bird head regions is suppressed, since the surface of the silicon substrate 1 at the brim portions of the silicon nitride film pattern 2 is not exposed, and the oxidation of the silicon substrate 1 per se does not largely proceed, and thus the main portion of the oxide film pattern 51' is formed by the oxidation of the poly-Si film 5.

At the process step corresponding to FIg. 3(b) the poly-Si film 5 is entirely disposed on and over the silicon substrate 1. But, the formation of a complete film layer is not always necessary. It is also effective to attain the purpose by selectively disposing a poly-Si film, which is essentially required to cover at least the brim portions of the silicon nitride film pattern 2.

As described above, a thin oxide film of 100–1,000 Å in thickness may be formed on the silicon substrate 1, before the formation of the silicon nitride film. This thin oxide film can serve as an etching stopper at the etching of the silicon nitride film pattern 2. On the other hand, after the process step shown in FIG. 3(a), the exposed surface of the silicon substrate 1 may be etched by use of the photo resist film pattern 3 as an etching mask like the case shown in FIG. 2(b), followed by the selective oxidation shown in FIG. 3(c). In this case, it is preferable to select a depth of concave portions to be about a half of a total value of a desirable field oxide film thickness plus 200–2,000 Å, for the purpose of obtaining a flat semiconductor device surface. The obtained field oxide film thus has a flush surface almost free from the bird beak and bird head problems thanks to the existence of the poly-Si film.

In the selective oxidation for forming field oxide films in semiconductor IC devices, channel stop diffusion techniques are usually employed in order not to induce surface inversion layers outside channel regions and under the field oxide layers. The channel stop diffution techniques provide a possibility of increasing an impurity concentration in the semiconductor substrate and under the field oxide film, by doping an impurity of a same conductivity type as that of the semiconductor substrate by, e.g. ion implantation prior to the formation of the field oxide film. Similar channel stop diffusion technique can be applied for the manufacturing method embodying the present invention by forming an impurity-doped poly-Si film or by doping an impurity into a formed poly-Si film. Then, impurity diffusion from the poly-Si film to the semiconductor substrate is effected during the selective oxidation.

Such an impurity-doped poly-Si film can be formed by a CVD method in an atmosphere containing an impurity source gas. On the other hand, when a non-doped poly-Si film is formed on a semiconductor substrate, impurity atoms can be introduced into the semiconductor substrate by an ion implanation or a thermal drive-in treatment. The employment of the impurity-doped poly-Si film is an advantageous feature that an oxidation time thereof is shorter by about 10% (for a case of oxidation in steam at 1,000° C. for a film with an impurity concentration of $1 \cdot 10^{13}$ cm$^{-2}$), compared with a non-doped poly-Si film. Therefore, the oxidation time can be slightly shortened.

Figure 4A:
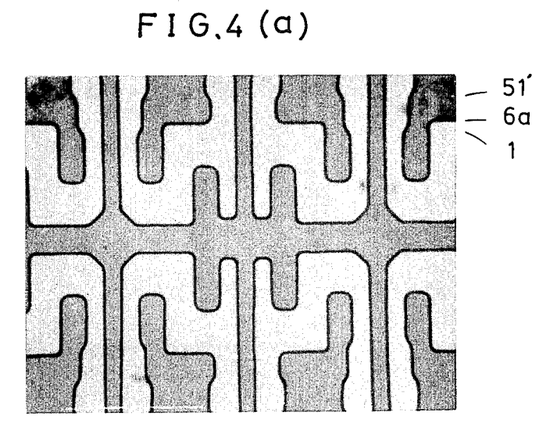
FIG. 4(a) and FIG. 4(b) are enlarged plan views corresponding to photographs taken of semiconductor device structures obtained by using a selective oxidation method embodying the present invention and a conventional selective oxidation method, respectively.
Figure 4B:
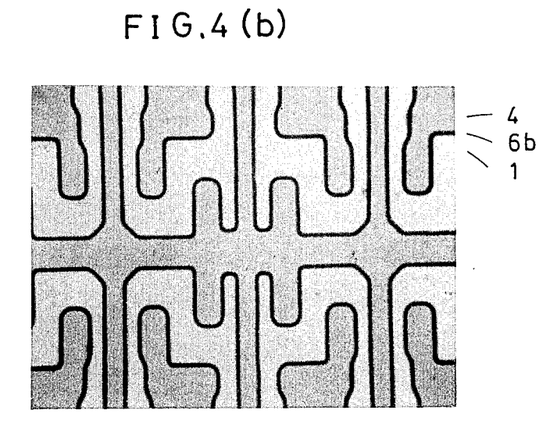

In order to compare performances of the selective oxidation method embodying the present invention with the conventional method, two semiconductor substrates are selectively oxidized. FIG. 4(a) and FIG. 4(b) are enlarged plan views corresponding to photographs taken of semiconductor device structures obtained in a selective oxidation method embodying the present invention and in a conventional selective oxidation method, respectively. These semiconductor device structures are obtained by the following process steps. For the structure produced in the manufacturing method embodying the present invention an underlying oxide film of 500 Å is formed on a silicon substrate surface 1, and a silicon nitride film of 1,200 Å is deposited thereon. Thereafter, a poly-Si film of 500Å in thickness is employed to grow a selectively oxidized film pattern 51' of 6,000 Å in thickness. On the other hand, the other semiconductor device structure with a selectively oxidized film pattern 4 is obtained by the conventional manufacturing method corresponding to the case of FIG. 1(a) and FIG. 1(b) under similar film thickness conditions but without forming a poly-Si film.

Magnification degrees in FIGS. 4(a) and 4(b) are ($\times 1,000$). Solid lines 6a are boundary regions between the exposed silicon substrate surface 1 and the field oxide film pattern 51'. Solid lines 6b are boundary regions between the exposed silicon substrate surface 1 and the selectively formed field oxide film pattern 4.

From the comparative observation of the photograph of FIG. 4(a) with the photograph of FIG. 4(b), it becomes clear that the widths of the boundary regions 6a are smaller than those of the counterpart regions 6b. This means that the bird beak-like irregular oxidation in the selectively grown oxide film is effectively diminished. Measurement results reveal that the width of the exposed silicon substrate surface 1 in the case of FIG. 4(a) is smaller by 0.26 μm than the width of the silicon nitride film pattern used as a mask for the selective oxidation process. On the other hand, the width of the exposed silicon substrate surface 1 in the case of FIG. 4(b) is smaller by 0.97 μm than the width of the silicon nitride film pattern used as a mask for the conventional selective oxidation process. This means that deviation errors in forming the selective oxidation film patterns are diminished by about ¼ in the case of the selectively grown oxidation film pattern 51'. Accordingly, it is possible to avoid the situation that semiconductor regions to be processed for forming semiconductor device elements therein become unnecessarily smaller than expected. This feature provides a possibility that semiconductor IC devices with much finer film patterns are produced with a much higher controllability and a larger integrated scale, as compared with the conventional semiconductor IC devices.

A second embodiment according to the present invention will be described in the following by referring to FIG. 5(a), FIG. 5(b), FIG. 5(c) and FIG. 5(d). FIG. 5(a) to FIG. 5(d) are cross-sectional views showing MOS-type semiconductor device structures at several steps in a second process embodying the present invention.

Figures 5A, 5B:
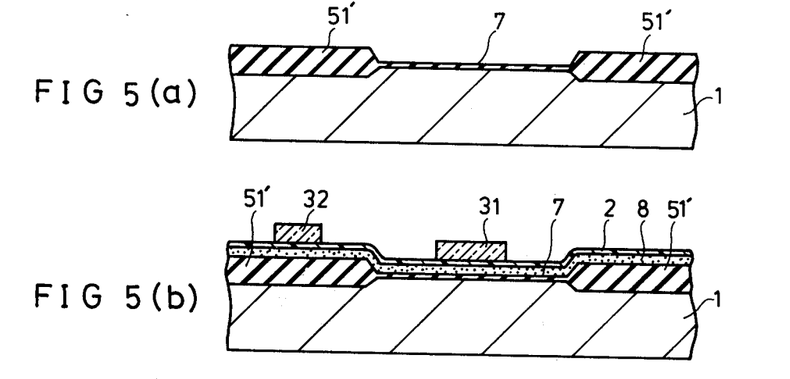
FIG. 5(a) to FIG. 5(d) are cross-sectional views showing MOS-type semiconductor device structures at several steps in a second example embodying the present invention.

A field oxide film pattern 51' of about 8,000 Å in thickness is formed on a silicon substrate 1 by a selective oxidation method which is similar to the method of the first example embodying the present invention described above. And therefore, the field oxide film pattern 51' has a superior pattern reproducibility. Then, a gate oxide film 7 of about 1,000 Å is formed at an active region, which is to be processed to form a MOS-type transistor therein, as shown in FIG. 5(a).

An impurity-doped poly-Si film 8 of about 4,000 Å is entirely deposited over the silicon substrate 1 with the oxide films by employing a CVD method. Subsequently, a silicon nitride film 2 of about 1,200 Å is further deposited on the impurity-doped poly-Si film 8. Next, a photo resist film is applied onto the entire surface of the silicon nitride film 2, followed by an exposure step by use of a photo mask and a development step to obtain photo resist film patterns 31 and 32. At later steps to be described below, a gate region will be formed under the photo resist film pattern 31, and a wire lead will be formed under the photo resist film pattern 32. In obtaining the structure shown in FIG. 5(b), a thin oxide film of about 500 Å (not shown) may be formed on the poly-Si film 8 prior to the deposition of the silicon nitride film 2, for the purpose of diminishing stress produced therebetween.

The silicon nitride film 2 is etched by a dry etching method by employing a CF₄-plasma gas and the resist film patterns 31 and 32 as etching masks, thereby to obtain silicon nitride film patterns 2' and 2". After removing the photo resist film patterns 31 and 32, another poly-Si film 9 of about 500 Å (corresponding to the poly-Si film 5 in the case of FIG. 3(b)) is deposited over the entire surface of the silicon substrate 1 as shown in FIG. 5(c).

Figure 5C:
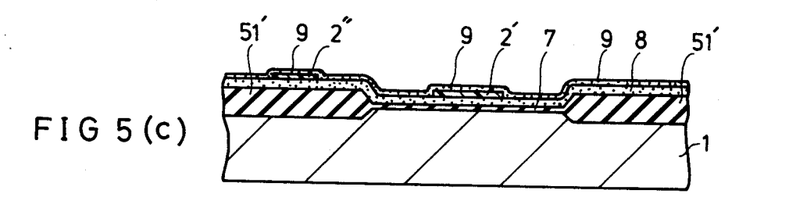

In obtaining the structure shown in FIG. 5(c), it is preferable to partly etch the surface of the poly-si film 8 after dry-etching the silicon nitride film 2, for the purpose of making the semiconductor device surface flat after the selective oxidation. Since the poly-Si film becomes about twice thick after the oxidation thereof, it is necessary to pre-adjust the thickness of the poly-Si film prior to the oxidation by etching the surface thereof to reduce the original thickness by about half. By this pre-adjustment it is possible to obtain a flat surface of a semiconductor device after the selective oxidation process.

Subsequently, the silicon substrate 1 with several layers thereon is heat-treated in an oxygen atmosphere thereby oxidizing the poly-Si films 8 and 9. During this heat treatment, the regions of the poly-Si film 8 underneath the silicon nitride film patterns 2' and 2" remain unoxidized. Next, the silicon nitride film patterns 2' and 2" are exposed by etching the oxidized regions of the poly-Si film 9 on the silicon nitride film patterns 2' and 2". This etching step is simultaneously carried out for other oxidized regions of the poly-Si film 9 to result in formation of an selectively grown oxide film pattern 10. And finally, the silicon nitride film patterns 2' and 2" are stripped off in hot phosphoric acid heated at about 160° C., and the selective oxidation process ends as shown in FIG. 5(d).

Figure 5D:
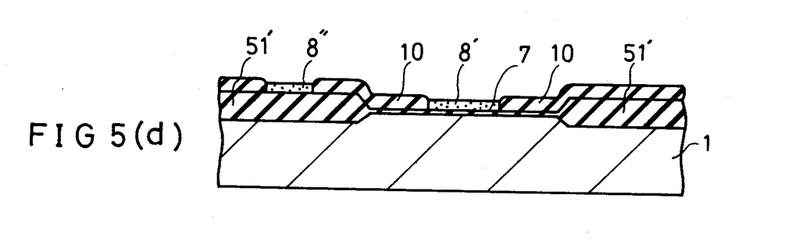

Starting from the semiconductor device structure shown in FIG. 5(d), a MOS-type transistor device is produced by the following steps. The unoxidized poly-Si film regions 8' and 8" are to be used as a gate electrode and a wire lead, respectively. After removing the oxide film pattern 10 on both sides of the region 8' for the gate electrode in its entirely, or slightly etching the surface of the oxide film pattern 10, impurity atoms of a conductivity type opposite to that of the impurity atoms contained in the silicon substrate 1, are ion-implanted by use of the gate electrode 8' and the previously formed field oxide film pattern 51' as masks, thereby obtaining a source and drain regions for a MOS-type transistor device. The obtained MOS-type transistor device produced by the manufacturing method embodying the present invention, can be provided with fine and accurate field oxide film patterns.

This advantageous feature is attained from the fact that the oxidized poly-Si film regions grown on and around the silicon nitride film patterns suppress deformation of the silicon nitride film patterns, which might upheave if they were exposed directly to an oxygen atmosphere during the oxidation process (cf. FIG. 1(c) and FIG. 2(c). The oxidized poly-Si film regions around the brim portions of the silicon nitride film patterns further serve to prevent oxygen gas diffusion from the brim portions of the silicon nitride film patterns to the regions lying underneath the silicon nitride film patterns. Therefore, the MOS-type transistor devices produced by the making method embodying the present invention are almost free from the conventional irregular oxidation problems (bird beak and bird head formation), and thus they can be provided with selective oxide films with fine and accurate pattern sizes in good reproducibility. Accordingly, the present invention can thus provide a possibility of producing MOS-type transistor devices with short gate lengths for inducing extremely short channel regions of 1 to 2 μm in a good reproducibility.

A third embodiment according to the present invention will be described in the following by referring to FIG. 6(a) to FIG. 6(e). FIG. 6(a) to FIG. 6(e) are cross-sectional views showing semiconductor device structures atseveral process steps in a third process embodying the present invention. In this embodiment, a silicon nitride film pattern is formed so as to be buried inside a semiconductor substrate, by an ion implantation method, and a field oxide film pattern is produced with a good degree of controllability.

Figure 6A:
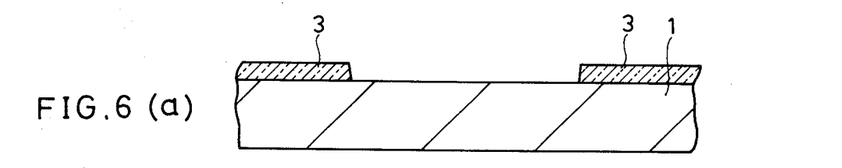
FIG. 6(a) to FIG. 6(e) are cross-sectional views showing semiconductor device structures at several steps in a third example embodying the present invention.

As a first step, a photo resist film is applied on a front surface of a silicon substrate 1, and it is effected under an exposure process by the use of a mask with patterns and developed to form a photo resist film pattern 3 as shown in FIG. 6(a).

Figure 6B:
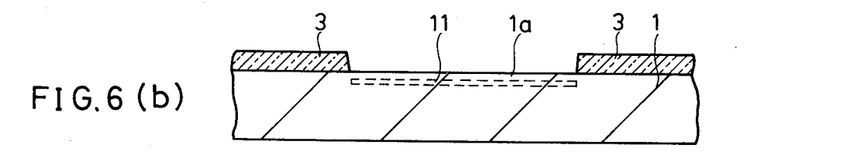

Then, nitrogen ions (hereinafter referred to as N⁺ions for short) are ion-implanted into the front surface region of the silicon substrate 1 by use of the photo resist film pattern 3 as an ion-implantation mask, so that an ion-implanted layer 11 is obtained in the silicon substrate 1. The ion-implantation is carried out under conditions, for example, with implantation energy of 50 to 100 KeV, a dose amount of $4 \times 10^{17}$ ions/cm². Under these conditions, the ion-implanted layer 11 is buried in the silicon substrate 1 with a silicon layer 1a of about 500 Å in thickness at the surface thereof as shown in FIG. 6(b).

When a positive-type photo resist material (for example, AZ 1350 supplied by Shipley Co.) is employed for the photo resist film pattern 3, a film thickness of more than 1.0 μm suffices for the masking function under the implantation energy range described above. The photo resist film pattern 3 is stripped off from the surface of the silicon substrate 1 to result in the structure shown in FIG. 6(c).

Figure 6C:
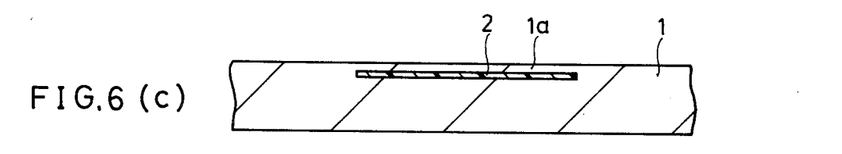

Next, a heat treatment step is necessary to be carried out in order to convert the ion-implanted layer 11 to a silicon nitride film, since most of the implanted N⁺ions exist as interstitial atoms. After removing the photo resist film pattern 3, a heat treatment is made for the silicon substrate 1 for about 60 minutes at a temperature of 1,000° to 1,100° C. in an inert gas atmosphere containing solely an inert gas or additionally an oxygen gas. During this heat treatment the interstitial nitrogen atoms scattered in the lattices move into silicon lattice locations, and the layer 11 is converted to a silicon nitride film 2. The silicon layer 1a existing above the silicon nitride film 2 becomes a 500–1,000 Å thick layer.

Thereafter, the surface of the silicon substrate 1 is entirely oxidized in an oxygen atmosphere, thereby forming thicker oxide films 51 and a thinner oxide film 52 on the silicon nitride film 2. At this oxidation step the thickness of the oxide films 51 is selected to be about 500–2,000 Å thicker than a thickness required for a field oxide film to be obtained as shown in FIG. 6(d).

Figure 6D:
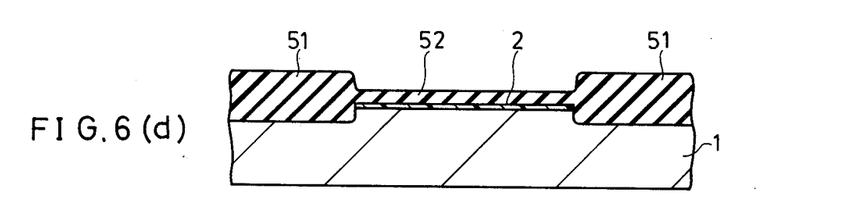

The silicon substrate 1 with the structure shown in FIG. 6(d) is provided with two kinds of oxide films 51 and 52. The oxide films 51 to be a field oxide film pattern is grown as a result of the oxidation of the surface of the silicon substrate 1. On the other hand, the oxide film 52 is made as a result of the oxidation of the silicon layer 1a and becomes twice as thick as an initial thickness of the silicon layer 1a. The thickness of the oxide film 52 is smaller than that of the oxide films 51, since the silicon nitride film 2 prevents penetration of the oxygen gas and no oxide regions are formed under the silicon nitride film 2.

Figure 6E:
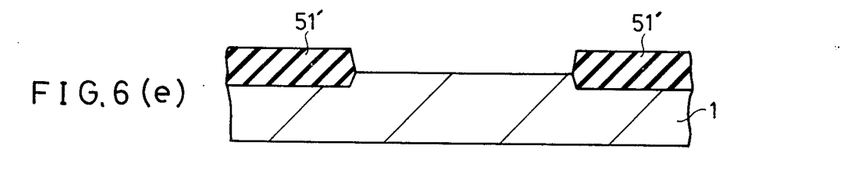

After etching the oxide film 52 grown on the silicon nitride film 2 and the exposed silicon nitride film 2, a field oxide film pattern 51' with a specified thickness is obtained, as shown in FIG. 6(e). At this etching step the oxide films 51 are simultaneously etched a little, and thus the resultant field oxide film pattern 51' is thinner than the oxide films 52.

The process embodying the present invention and exemplified in FIG. 6(a) to FIG. 6(e) has advantageous features similar to those of the first and second embodiments. That means, the brim portions of the silicon nitride film are not directly exposed to an oxygen atmosphere, but are covered with portions of the silicon substrate, so that irregular oxidation frequently accompanied with the conventional oxidation process can be effectively suppressed.

In conclusion, the present invention provides a possibility of selectively growing oxide films almost free from uneven surface regions, which conventionally arise from the bird beak and bird head formation. By employing field oxide film patterns produced by the methods claimed in the instant application, it is possible to manufacture MOS-type transistor devices provided with fine device structural patterns, which are made by accurate copying of mask patterns. Therefore, the claimed methods have great importance in manufacturing industry of the large scale integrated circuit devices.

What is claimed is:

1. A method of making a semiconductor device comprising the successive steps of:
    (1) forming an anti-oxidation film pattern within a semiconductor substrate by ion implantation with a thin region of the semiconductor substrate remaining intact above the anti-oxidation film pattern so formed;
    (2) oxidizing the entire surface of the semiconductor substrate including the semiconductor layer on said anti-oxidation film pattern using the thus-formed anti-oxidation film pattern as a selective oxidation mask thereby leaving a resion of said substrate which is under said anti-oxidation film pattern unoxidized while protecting at least the brim portions of the anti-oxidation film pattern from exposure to the oxidizing atmosphere while producing a silicon dioxide coating adapted for use as a field oxide, and continuing the oxidation until the resultant oxidized regions adjacent and around the anti-oxidation film pattern, except those regions directly above it, have bottom faces deeper than the bottom face of said anti-oxidation film pattern in the semiconductor substrate while substantially suppressing irregular oxidation about the edges of the anti-oxidation film pattern;
    (3) removing said oxidized surface regions overlying said anti-oxidation film while only partially removing said oxidized regions formed directly on said semiconductor substrate thereby exposing the entire surface of said anti-oxidation film pattern; and thereafter
    (4) removing said anti-oxidation film.

2. A method of making semiconductor devices in accordance with claim 1, wherein
    said anti-oxidation film pattern is made of a silicon nitride film.

* * * * *